United States Patent [19]

Vinal

[11] Patent Number: 4,485,419

[45] Date of Patent: Nov. 27, 1984

[54] COMPLEMENTARY POLE COUPLING MAGNETIC HEAD STRUCTURE

[75] Inventor: Albert W. Vinal, Cary, N.C.

[73] Assignee: International Business Machines Corporation, Armonk, N.Y.

[21] Appl. No.: 388,784

[22] Filed: Jun. 15, 1982

[51] Int. Cl.$^3$ .................................................. G11B 5/12
[52] U.S. Cl. ...................................... 360/125; 360/122
[58] Field of Search ......... 360/125, 126, 127, 111–113

[56] References Cited

U.S. PATENT DOCUMENTS

| | | | |
|---|---|---|---|
| 3,887,944 | 6/1975 | Bajorek et al. | 360/113 |
| 4,120,011 | 10/1978 | Kolb, Jr. | 360/111 |
| 4,123,790 | 10/1978 | Moeller et al. | 360/111 |
| 4,164,770 | 8/1979 | Jeffers | 360/113 |
| 4,182,987 | 1/1980 | Moeller | 324/249 |
| 4,277,808 | 7/1981 | Nagaki | 360/113 |

OTHER PUBLICATIONS

IBM/TDB, vol. 17, No. 4, Sep. 1974, pp. 967–968, "Magnetoresistive Read Heads", by Bate et al.
Soviet Inventions Illustrated, Sec. El., Week D 02, Feb. 18, 1981.

Primary Examiner—John H. Wolff
Attorney, Agent, or Firm—Edward H. Duffield

[57] ABSTRACT

An improved generic form of magnetic read head design is described. Several versions of designs for reading the vertical component of magnetization from a recorded magnetic medium, where data is written in the form of magnetic polarity reversals of transitions, are described. All of the designs utilize the principle of coupling of complementary magnetic poles from the medium to the sensor to improve the magnitude of magnetic field experieced by the sensor. All the designs also utilize two coupling legs arranged in vertical relationship to the recording medium. The legs are relatively widely spaced apart to have their ends proximate to complementary magnetic pole transitions on the medium for a given density of data (expressed as flux changes per inch). The other ends of the coupling legs are brought close together to direct the coupled field from the medium through a narrow gap in which a magnetic sensor is located. The coupling legs in the magnetic sensor are oriented relative to one another within this gap area such that the magnetic flux field passes through the most sensitive plane of the sensor.

5 Claims, 31 Drawing Figures

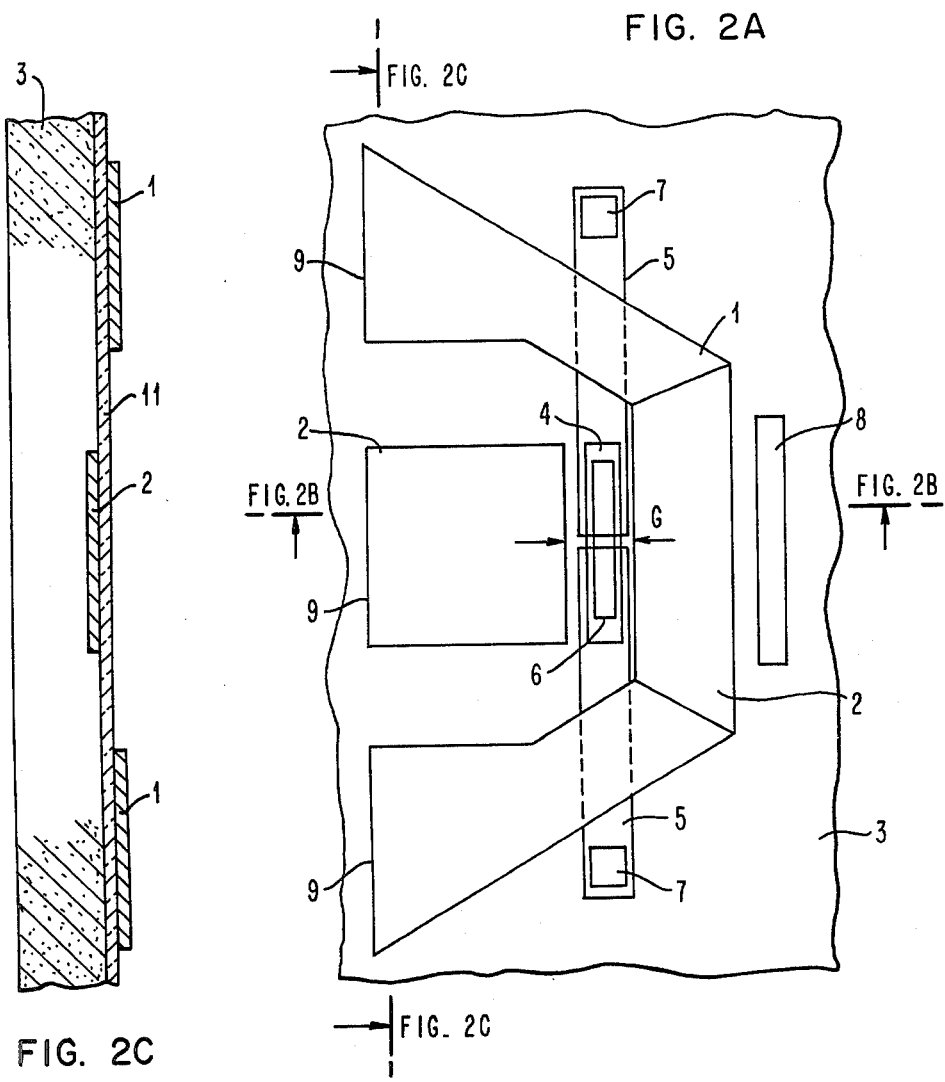
FIG. 2A
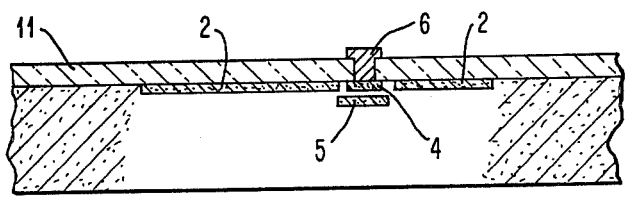
FIG. 2C
FIG. 2B

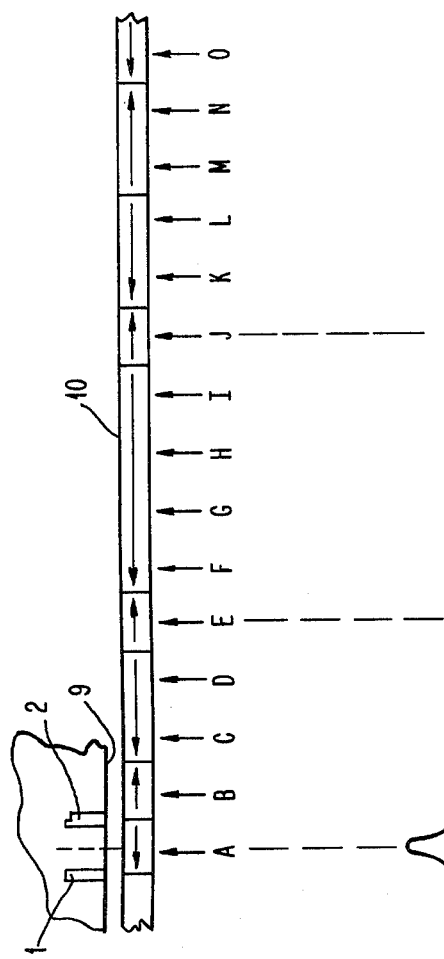
FIG. 4A
FIG. 4B SIGNAL
FIG. 4C DATA CLOCK

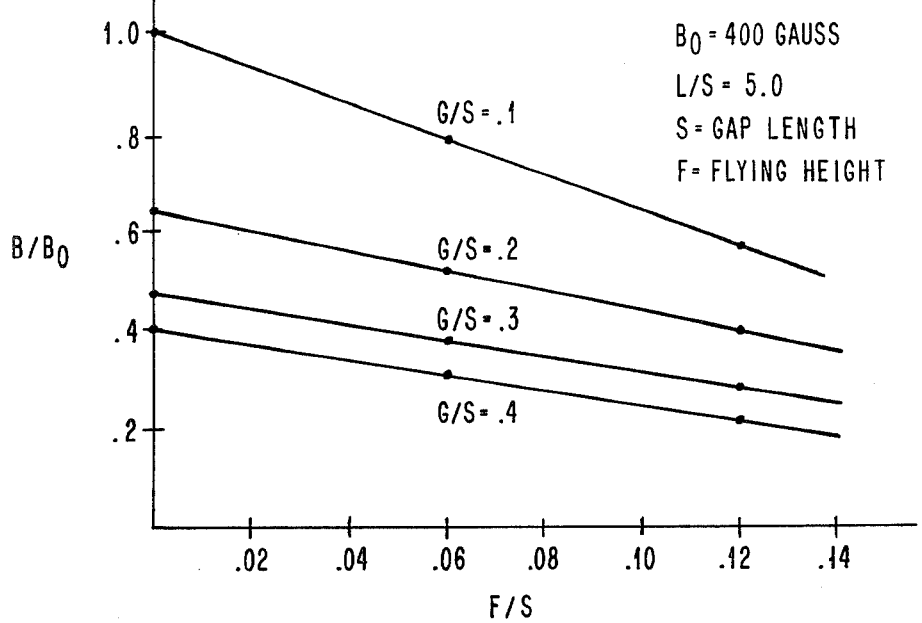
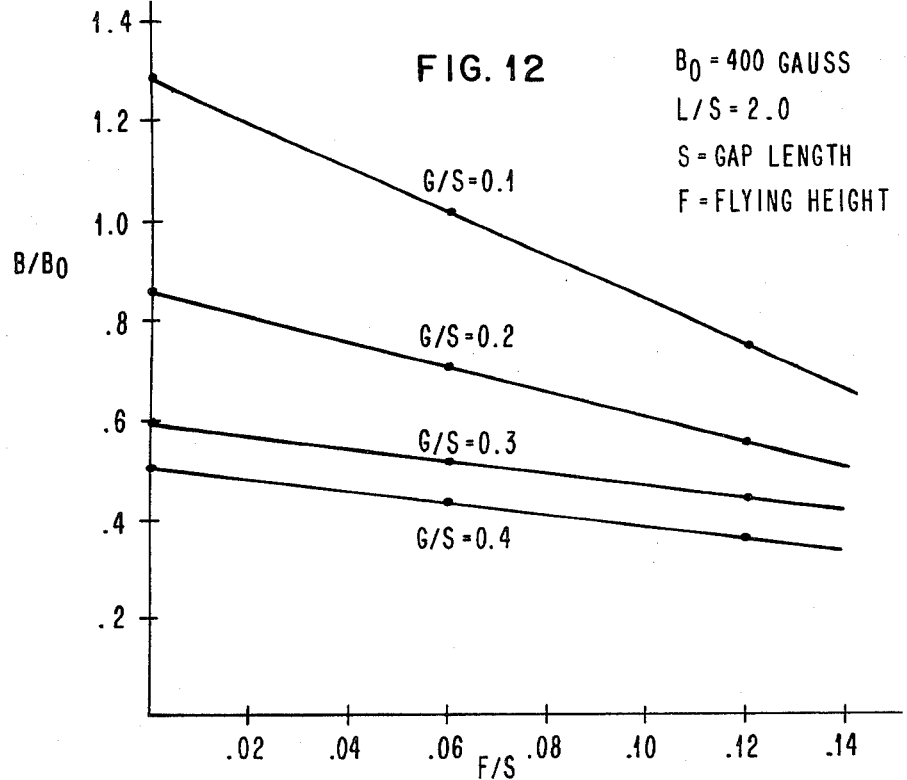

COMPLEMENTARY POLE COUPLING MAGNETIC HEAD STRUCTURE

RELATED APPLICATIONS

This application is related to my copending application Ser. No. 388,783, filed June 15, 1982 dealing with an improved magnetic recording technique using dual tracks with complementarily poled magnetic transitions on the tracks.

FIELD OF THE INVENTION

This invention relates to magnetic reading heads and magnetic sensors in general. It specifically relates to improved magnetic read head structures employing field coupling conductive legs or similar means for bringing the magnetic field from the magnetic medium to the sensor at relatively high intensity and in the most sensitive preferred plane for the magnetic sensor.

PRIOR ART

The search for means of reading (and writing) higher and higher digital data densities on the magnetic mediums is a continuing one. Numerous technical problems beset the researcher in this field. Factors such as reading head flying height, reading head wear, frequency response, cross talk, interbit interference, sensor non-linearity and noise are but a few of the factors entering into good magnetic read head design. A considerable amount of effort has been directed at the replacement of inductive read head structures which are passive, velocity sensitive devices, with solid state non-velocity sensitive devices as the sensor element. All of the approaches are ultimately limited by the inherent gain band width requirement prescribed by sensitivity and frequency response of the magnetic element.

There are two basic methods of increasing data density recorded on a magnetic medium. One method is to increase the number of bits recorded per lineal inch in each track or tracks. The technique is seriously limited by the flying height by which the read head nominally moves out of contact with the medium surface. The reason for this is that increasing the number of bits per lineal inch written in a given track for a given flying height increases the distortion of the read back signal. It also significantly reduces the read back signal amplitude. The overall signal to noise ratio thus inevitably suffers with any given read head as the data density in flux transitions in a linear inch in a track of data are increased.

A second method is to increase the density of the recorded data tracks. Limitations in the magnetic read head technology make the usual inductive coil passive reading head incapable of sensing a 1-micrometer wide data track because of the signal to noise limitations in the read back signal produced by such a device.

Regardless, however, of how small one can make a sensor element, the flying height requirements prescribed by the data density will usually be so small that the sensor by itself cannot be placed close enough to the medium without damage to it. An additional technical problem is thus posed: how does one couple the magnetic data field from a single bit recorded on the medium to a sensor positioned at some remote altitude, relatively speaking, from the medium itself. The ultimate objective is to achieve as high a degree of field coupling as possible so as to derive a maximum signal to noise ratio from the sensor output.

The concept of field coupling is not new. It basically dates back many years to inductive read heads when the sensor element consisted of a coil of wire. Solid state sensors, however, require a considerable amount of ingenuity in order to permit practical flux coupling to be produced for the most sensitive axis of the sensor. Active sensor elements have recently been developed and may be found, for example, in my copending application Ser. Nos. 253,128, and 388,773, which deal with such magnetic sensor elements specifically.

The fundamental problem of designing a read head to couple large magnetic field components from the medium to a magnetic sensor positioned above the medium remains. A minute solid state magnetic field sensor can be constructed, but it appears undesirable or impossible to place such sensors in direct contact with the medium since wear would destroy the sensor. As a practical matter, the sensor should still be made very small since this factor is largely responsible for the resolution of the read head. However, most magnetic sensors have a more sensitive axis and hence, a problem arises with the notion of coupling significant magnetic fields to the desired plane of sensitivity in the sensor. It is generally most practical to have the magnetic fields applied parallel to a surface of magnetic sensors built in a silicon chip since the plane of a chip surface is more accessible. This criterion immediately eliminates Hall cell devices from consideration since the sensitive axis for such devices is normal to the devices' surface. As noted in my above-referenced copending applications, a new magnetic sensor has been developed to solve some of these problems. A version of the device is available as a sensor which is constructed so that magnetic fields parallel to the plane of the semiconductor chip will intercept the sensitive axis.

The problem then remains of achieving a high field coupling from vertical components of the magnetic flux transitions on the recording medium to the inherently small, generally planar device which is the magnetic sensor.

My above-noted related copending application describes a new high data density recording technique in which complementarily poled magnetic transitions are written in dual tracks. This technique allows high flux coupling since a full field reversal can be passed through the magnetic sensor given a suitable magnetic read head structure for coupling the flux transitions to the sensor.

OBJECTS OF THE INVENTION

In view of the foregoing known difficulties with prior art magnetic read head structures, it is an object of the present invention to provide improved magnetic read heads in which coupling legs couple complementary poled magnetic field components from the recording medium to the sensor.

Still another object of this invention is to provide an improved magnetic read head in which the coupling legs span a full flux reversal at the basic flux change per inch density of writing on the magnetic medium for transition densities of between 10,000 and 40,000 per inch and with track densities of 12,000 or more tracks per inch.

Still another object of the invention is to provide an improved means of using a magnetic read head structure with flux coupling legs for complementarily poled magnetic transitions in either a dual track or single track read head without changes in physical structure.

SUMMARY

The foregoing and still other objects of the invention which have not been specifically enumerated are met as follows.

First, it is assumed that a suitable written magnetic medium having a given density of flux changes per inch exists. Given any of the known encoding techniques for writing digital data on magnetic media, the flux changes per inch will be expressed in terms of a maximum number of flux changes or bits per inch. These flux changes can be written either in a dual complementary poled track method as described in my aforementioned co-pending application or can be written in a single track as is conventionally done.

Given such a written medium, the read head of the present invention is provided with magnetic flux coupling legs having relatively "widely" spaced ends which are in proximity to the magnetic medium. They are so spaced as to lie at the nominal flux transition spacing of the medium (in a single track mode) or to straddle exactly two data tracks in the dual track mode. However, they do confront, in either event, complementarily poled field transitions. Those recording techniques which require a clock track (such as NRZ recording where flux changes may cease during the time that all similar digital bits are being written) are already well known and can be easily utilized by the present read head structure.

The magnetic coupling legs of the present structure are arranged to lie in a generally vertical plane or planes relative to the magnetic medium. These legs conduct the flux field therefrom at the complementarily poled field transitions to a narrow gap at the opposite end of the two coupling legs. A magnetic sensor is located in this gap. The small gap is oriented in such a fashion as to cause the flux field to pass through the most sensitive area of the sensor.

The present invention will now be described in greater detail with reference to a preferred embodiment as illustrated in the drawings in which:

BRIEF DESCRIPTION OF THE DRAWINGS

FIG. 2A illustrates a plan view of an alternative design for the read head such as that shown in FIG. 1A but in which one of the coupling legs has been formed into a general U shape to surround the other leg as shown.

FIG. 2B is a cross-sectional elevation taken along lines AA in FIG. 2A to illustrate the various layers and materials and method of forming the magnetic read head shown in FIG. 2A.

FIG. 2C illustrates an end elevation of surface 9 as shown in FIG. 1A.

FIG. 4A illustrates schematically an example of magnetic coupling legs as they would pass along a strip of magnetized media encoded in any chosen manner, but exemplified as an NRZ recording.

FIG. 4B is the signal amplitude representation developed by a magnetic sensor interposed in the gap between the two legs of a structure corresponding to that shown in FIG. 2 scanning the data strip as shown schematically in FIG. 4A.

FIG. 4C is a readout of the data significance and a clock track for determining data points when no signal transitions are apparent.

FIG. 11 illustrates a plot of experimental data revealing the average relative field experienced by a sensor in the gap of the coupling legs such as shown in FIG. 8 as a function of the flying height F and a gap width G normalized to the transition to transition spacing S.

FIG. 12 is a plot similar to FIG. 11 but the length of the magnetic coupling legs L is twice the length of the transition to transition spacing length S instead of five times the length S as illustrated in FIG. 11.

DETAILED SPECIFICATION

Figure 1A:
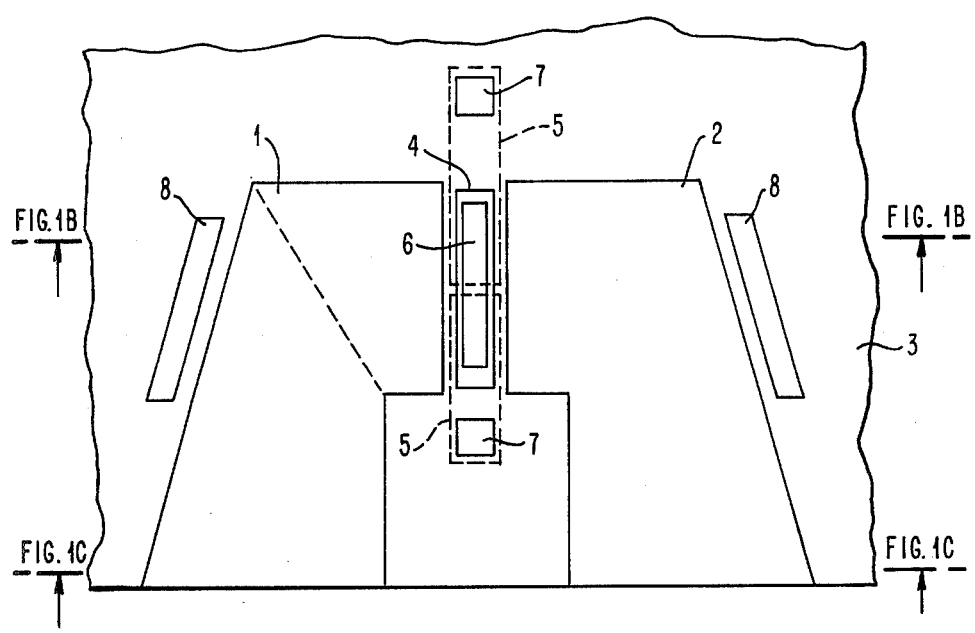
FIG. 1A illustrates a plan view of a preferred form of the embodiment integrated on a semiconductor substrate together with a semiconductive magnetic sensor placed in the gap between the two legs of permeable magnetic flux field coupling material.
Figure 1B:
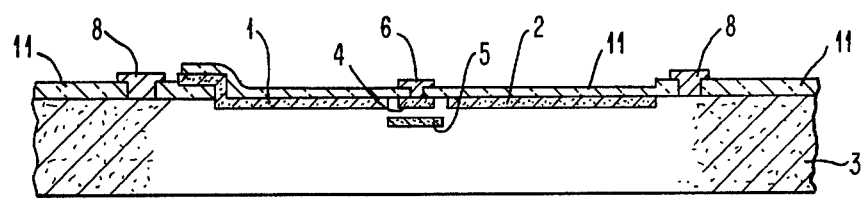
FIG. 1B illustrates a sectional elevation taken along lines AA in FIG. 1A to illustrate the layers of material and the processing technique for forming the read head as shown in FIG. 1A.
Figure 1C:
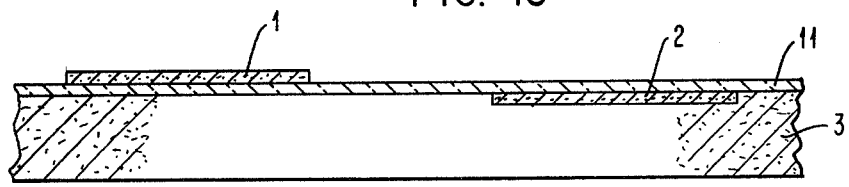
FIG. 1C illustrates an end elevation of surface 9 as shown in FIG. 1A.

Turning to FIGS. 1A, 1B and 1C respectively, illustrative top, cross sectional and elevation views of a single channel read head configuration according to the principles of the present invention are schematically shown. The particular magnetic sensor illustrated and utilized in this design is a lateral bipolar magnetic transistor operating in the vertical injection mode. Such devices are illustrated in my copending patent application Ser. No. 253,128. Such magnetic transistors utilized as sensors are new. Those unfamiliar with the operation thereof may turn to the noted patent application for a complete treatise on the subject. The operation of the basic magnetic sensor, other than to describe that it is most sensitive to magnetic fields which are parallel with the emissive surface of the emitter, is unnecessary for purposes of the present invention, however.

Vertical injection of minority carriers as required for operation of the sensor is achieved in the structure shown by confining injection to the lower surface of the emitter PN junction. Application of magnetic fields in the vicinity of the emitter and parallel with the injecting surface are nominally oriented perpendicular to the long axis of the emitter diffusion in the figure. This creates a Lorentz potential along the long axis of the emitting PN junction as described in my aforementioned patent application. The Lorentz potential modulates carrier injection along the length of the emitter such that one side or the other of the emitter surface will inject more heavily and one collector or the other will collect more current.

The magnetic field (or demagnetizing component in the vertical direction) developed at the boundaries of magnetic transitions which exist in a magnetic medium written with data in either the horizontal magnetization or vertical magnetization mode are directly coupled to the emitter region of the sensor as shown in FIG. 1A by means of magnetic coupling legs 1 and 2. These coupling legs are formed of nickel iron alloy and are highly magnetically permeable as is well known to those of skill in the art. The legs may be vacuum deposited on the upper oxide layer of insulator on the top surface of a semiconductor substrate 3. In substrate 3 are deposited the emitter 4 and collectors 5 in accordance with the teachings of my aforementioned patent application. An emitter contact 6, two collector contacts 7, and base contacts 8, are also shown for purposes of completeness but are not essential to the understanding of the present read head structure.

The edge of the silicon substrate 3 has been ground away along the surface 9 to form a flush surface. When the semiconductor substrate 3 is stood up on this surface 9 and placed in proximity to a magnetized medium, the magnetic field components in the vertical direction can be coupled through the legs 1 and 2 to pass through the gap between the legs 1 and 2 in which the sensor lies as depicted in FIG. 1A. The orientation of the field coupling is such that the field components will pass through the semiconductor parallel to the emissive plane of the emitter 4 as required for maximum effectiveness. The structure shown in FIG. 1A can easily be manufactured using common silicon semiconductor LSI fabrication techniques. This will be better understood with relation to FIG. 1B where a horizontal cross section of the structural elements in FIG. 1A taken along the line AA therein is shown.

The magnetically permeable legs 1 and 2 are displaced to lie lower than the surface of the surrounding areas by machining or by reactive ion etching a trench generally on either side of the emitter area 4 in FIG. 1A so that the magnetically permeable magnetic film coupling legs 1 and 2 will be opposite one another across the plane in which the emissive surface of the emitter 4 lies.

The magnetic film coupling legs 1 and 2 are designed to have equal cross sectional area but are not at the same physical elevational plane (in cross section) at the end thereof which lies along surface 9 in FIGS. 1A, 1B and 1C. The reason for this displacement in elevation of the two legs 1 and 2 is that the vertical component of magnetization on a sequentially magnetized magnetic tape, disc or the like will be separated from one another by a distance S. S is generally the transition to transition spacing that is the reciprocal value of the maximum number of flux changes per inch written along the medium. The altitude difference in FIG. 1B is approximately 12,700 Angstrom units for 20,000 flux changes per inch in recording density and, correspondingly, 6,350 Angstrom units for 40,000 flux changes per inch density, etc.

It is preferred to use reactive ion etching techniques for precise control. Once the emitter and collectors have been diffused into the surface of the substrate, or implanted as the case may be, and an overlying insulating oxide layer has been grown, windows opened up for contacts 6, 7 and 8, etc., the area for etching away the semiconductive substrate 3 to lower the magnetically permeable leg 2 and the end of leg 1 where it confronts the emissive surface of the emitter 4 can be masked off and then etched away as depicted by the cross hatched area on FIG. 1A for legs 1 and 2. In the example depicted therein, leg 2 lies at a distance below the level of leg 1 in horizontal cross section such as shown in FIG. 1B. The ends of the legs 1 and 2 where they confront the emitter 4 are at the same altitude so that the flux field is coupled directly across between the ends of the legs 1 and 2 and passing parallel with the emissive surface 4 on its bottom side but between it and the collectors 5. Once the area for these legs has been configured to the desired depth, then the magnetic film layers can be deposited in the configuration shown. The injecting surface of the emitter 4 will be below the surface of the silicon substrate to whatever the depth of the emitter diffusion is.

FIG. 2A illustrates an alternative version of a single track magnetic read head in accordance with the present invention. In FIG. 2A, a plan view showing the coupling legs 1 and 2 on a substrate 3 and including the other elements of the magnetically sensitive transistor 4 through 8 as depicted in FIG. 1A is shown. The trenched out or reduced elevation trough area is again cross hatched in the FIG. 2A so that when the magnetically permeable film forming legs 1 and 2 are deposited, the ends of the legs which abut the emitter area 4 will be at the appropriate depth, i.e., the emitter diffusion depth. This will pass the magnetic flux field coupled from the magnetic medium by the legs 1 and 2 through the most sensitive plane of the magnetic transistor elements. A cross sectional view taken along lines AA is shown in FIG. 2B and an elevation in FIG. 2C completes the description to show the relative planes of the legs.

In the FIGS. 1 and 2, it will be seen that the magnetic read head structure includes a magnetically sensitive electrical transducer having an active or a most sensitive plane. It also includes at least two magnetically permeable field coupling legs which are separated from one another at the interface with the magnetic medium. These legs form a relatively small gap in which the magnetically sensitive element is placed. It will be noted that the magnetic field coupling will be a maximum because of the offset in elevation between the input end of the magnetic coupling legs such that they will confront the vertical maxima of the demagnetizing magnetic fields which are present at the transition boundaries on the magnetic medium for the given data density written thereon as previously described. Also, the magnetic coupling legs are arranged such that, where they adjoin the magnetically sensitive element, they are in the same plane and pass the magnetically coupled flux through a plane parallel to the most sensitive area of the sensor.

In principle, the altitude difference in separation between the two magnetically permeable coupling legs 1 and 2 should correspond exactly to the minimum separation distance between successive magnetic transition boundaries written along a magnetic medium. This is the reciprocal of the maximum number of flux changes per inch recorded on the media. As will be seen shortly, it does not matter whether the magnetic medium has been written utilizing a longitudinal recording technique or a vertical magnetization recording technique. The ends of the magnetically permeable legs where they confront the magnetic medium will coincide with the magnetic poles and the poles will be complementary; that is, one leg will lie on a positive pole and the other on a negative pole. Thus, the highest possibly available magnetic field will be available for coupling through the legs and to the sensor. This field coupled through the gap between the two legs in which the sensor is located, produces a differential voltage on the output taken at the collector contacts 7 as described in my aforementioned copending patent application. The polarity and magnitude of the voltage developed depend upon the polarity and magnitude of the field crossing the gap in the magnetic coupling structure depicted. When the longitudinal position of a read head having this structure is relative to a magnetically recorded media such that the ends of the legs confronting the media lie between magnetic poles produced by the recorded bits, the field coupled to the sensor will be close to zero and the differential voltage between the sensor collector outputs will be essentially zero as well.

Figure 3A:
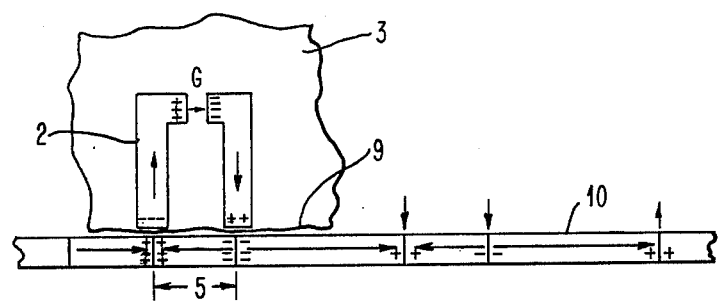
FIG. 3A illustrates a schematic view of several of the main elements of a magnetic read head according to the invention and shows how the magnetically permeable coupling legs are to be positioned adjacent to complementary magnetic poles on a magnetic medium.

FIG. 3A illustrates schematically a horizontal elevation of a magnetic read head embodied on a silicon substrate 3. The substrate 3 has been turned up so that its flush ground edge 9 is proximate to the upper surface of a magnetically recorded medium 10. The flux coupling legs 1 and 2 thus lie in a generally vertical plane or planes and the separation between these legs as shown in FIG. 3A at the medium interface is equal to the transition to transition spacing as depicted.

Figure 3B:
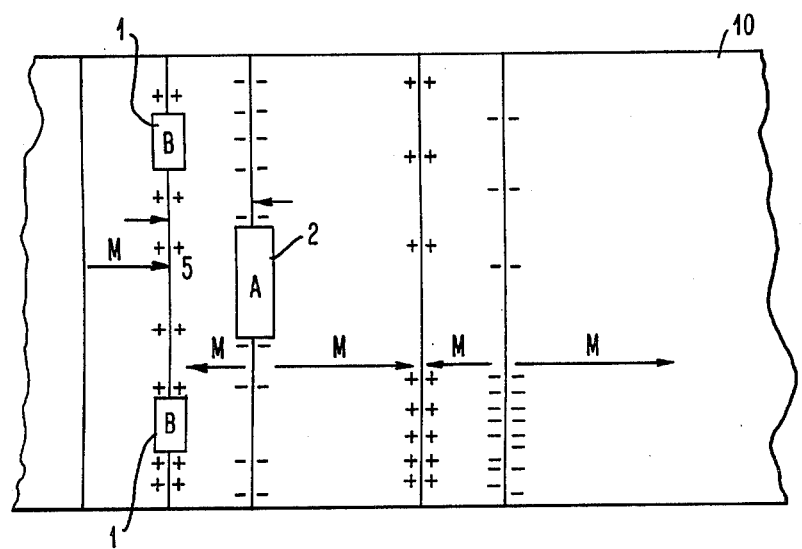
FIG. 3B is a plan view of a magnetic read head of the type shown in FIG. 2A and shows the footprint of the magnetic coupling legs passing over a stripe of magnetically recorded data on a magnetic medium which has been written in the horizontal magnetization mode such as that shown in cross section in the magnetic medium in FIG. 3A.

For the structure illustrated in FIG. 2A and 2B, FIG. 3B illustrates the footprint or area covered by the ends on surface 9 of the flush ground coupling legs 1 and 2.

FIG. 3B is the plan view corresponding to the elevation in FIG. 3A with the magnetization vectors in the horizontal recording mode as shown and with the vectors indicated by the arrows labeled M in the drawing. The vertical component of demagnetization field will have complementary poles + and − as illustrated in the drawing. It may be seen that when the coupling legs 1 and 2 are arranged to lie at different elevational depths on the semiconductor substrate as depicted in FIGS. 1B and 2B such that when the substrate 3 is elevated to lie in the vertical plane relative to the medium 10, the legs 1 and 2 will be offset by the transition to transition spacing S as shown in FIGS. 3A and 3B.

Turning to FIGS. 4A through 4C, a more expansive schematic is illustrated. In FIG. 4A, a hypothetical schematic showing the positioning of the two coupling legs 1 and 2 with surface 9 of the substrate 3 placed in conjunction to the upper surface of a magnetically recorded medium 10 which has been written in the horizontal magnetization mode as indicated by the arrows M is shown. The center of each written bit A through O is indicated as well in an assumed form of coding.

FIG. 4B, drawn vertically centered below the track in FIG. 4A, illustrates a representative analog signal amplitude output from a sensor lying in a magnetic read head structure such as those shown in FIGS. 1 and 2 and scanning the pattern shown in FIG. 4A. The significance of the data is somewhat arbitrary and may be accorded any coding convention desired as is well known to those of skill in the art. FIG. 4C illustrates the clocking times either derived from the magnetic transitions utilizing a phase locked oscillator to maintain accurate clock points, or from a different recorded clock track such as is well known in the art. The data significance accorded to the transitions is, as mentioned, arbitrary but is assigned for purposes of this description the data 1 and 0 bits shown in association with the clock signal positions in FIG. 4C.

Figure 5A:
FIG. 5A illustrates a schematic view of a read head structure such as shown in FIGS. 1 or 2 in which the magnetic medium has been recorded in the vertical mode.
Figure 5B:
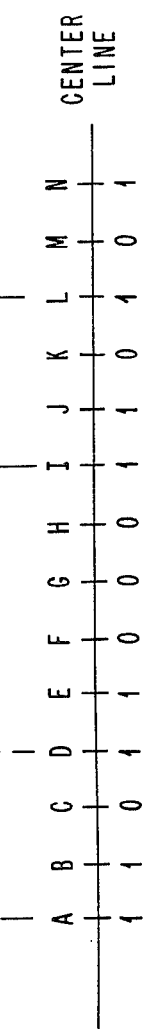
FIG. 5B illustrates a clock and data read out track.
Figure 5C:
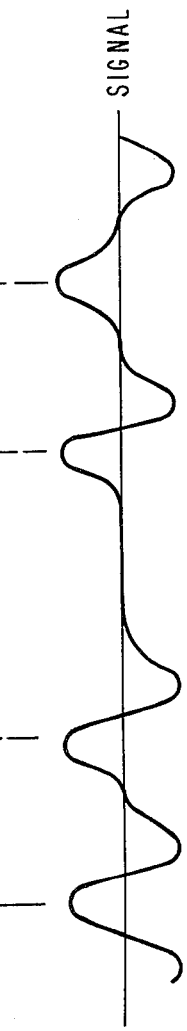
FIG. 5C illustrates an amplitude plot of the signal produced by a read head of FIGS. 1 or 2 scanning the encoded strip in FIG. 5A.

FIG. 5A illustrates a schematic similar to that of FIG. 4A but with the magnetization conducted in the vertical mode as shown by the arrows M in the medium 10. The clock and data output are shown in FIG. 5B positioned vertically below FIG. 5A in similar fashion to that shown in FIG. 4C for FIG. 4A. FIG. 5C illustrates the analog waveform output of a sensor built into a read head structure such as that shown in FIGS. 1 or 2 and scanning the data track shown in FIG. 5A. The data significance for the data bits A through N is, again, arbitrarily assigned and many encoding conventions are known.

It may be observed that in the transition region generally lying between transitions E and J in FIG. 4A and between transitions E and I in FIG. 5A do not illustrate any change in amplitude at the sensor output in FIGS. 4B or 5C. During these times, the clocking pulses are used together with logic well known in the art to generate data bits since no flux transitions are present in the recorded medium. It will be appreciated that if self-clocking codes such as F2F or slot two-slot or the like were employed in recording the magnetic medium, given that the separation between the magnetic coupling legs 1 and 2 were appropriately chosen, no additional clocking would be necessary since data transitions would always be present at the appropriate times to provide a self-clocking code output. The present read head structures are thus not limited to any specific encoding technique although a given read head, once configured with the separation distance between the coupling legs 1 and 2 will be most effective only for data recorded at the appropriate frequency or in the appropriate coding technique.

Figure 6A:
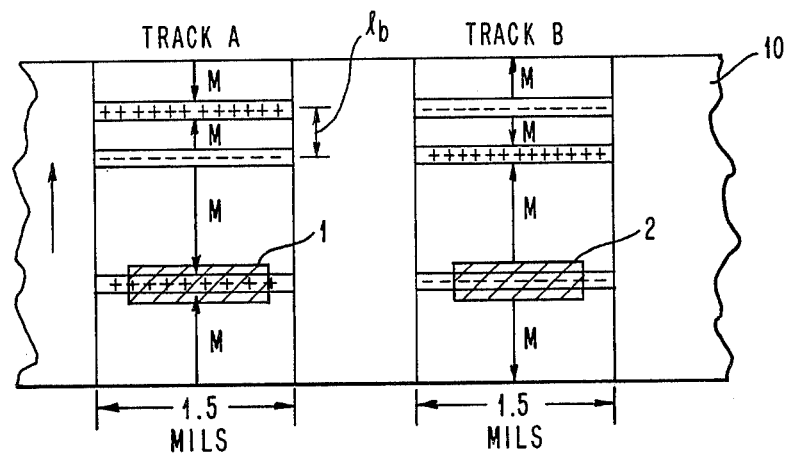
FIG. 6A illustrates a plan view of an alternative recording technique and the footprint swept out by the coupling legs of an alternative read head design.
Figure 6B:
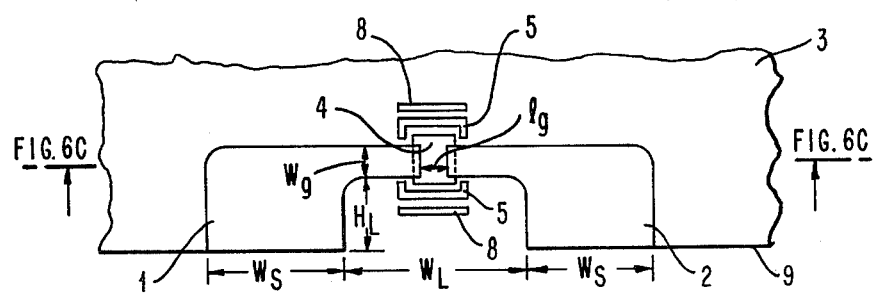
FIG. 6B illustrates a schematic or simplified plan view of an alternative embodiment of a magnetic read head for reading material as shown in the schematic two track plan in FIG. 6A.
Figure 6C:
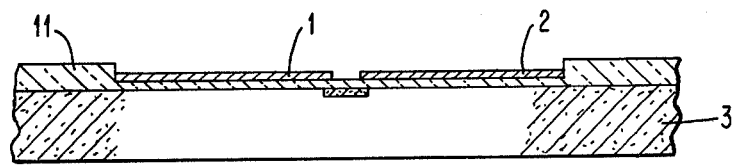
FIG. 6C is an elevational cross section taken along lines 8A in FIG. 6B.

Turning to FIGS. 6A through 6C, another preferred embodiment of the invention is depicted. As shown in FIG. 6B, the magnetically permeable coupling legs 1 and 2 are again separated from one another at their edge 9 which confronts a magnetic medium. A gap between the other ends of the legs 1 and 2 has a magnetically sensitive transistor element 4 through 8 similar to that previously described. However, the legs 1 and 2 are at the same altitude in FIGS. 6A through 6C and do not have different elevations. This is because this particular read head configuration is intended for reading the dual track magnetically encoded data recorded in accordance with the teachings of my copending patent application Ser. No. 388,783. In this recording technique, complementary magnetic polarity transitions are simultaneously written in the dual track pattern forming a given data channel. There is no lateral offset in the direction of motion between these transitions so the read head which straddles them need not have the input ends of the magnetic coupling legs offset in the elevational sense as previously described for the structure shown in FIGS. 1 and 2.

In FIG. 6A, the magnetic transitions I are separated from one another in the direction of travel on the magnetic medium by a distance $l_b$ which corresponds to the distance S or the reciprocal of the maximum density of flux changes per inch previously referred to. Two data tracks A and B as labeled are simultaneously recorded as described in my aforementioned copending patent application Ser. No. 388,783 in two parallel tracks to form a single data channel. The footprint or end surfaces of the coupling legs 1 and 2 on surface 9 are shown in FIG. 6A in the horizontal dashed areas straddling a given set of magnetic transition poles in two adjacent tracks forming a single channel. It will be appreciated that a magnetic flux coupling of maximum intensity will thus be coupled from track A, through leg 1, through the gap and through the sensor, back through leg 2 and into track B, for example. The two tracks A and B that form a given data channel may be separated from one another by any nominal distance but typically one-half the width of each track would be suitable. The tracks, of course, can be widely separated and other intervening tracks corresponding to tracks for other data channels can exist. The separation distance between tracks is not critical insofar as the writing of data is concerned, but does serve as a means of optimaly designing the read back head so that a minimum field flux leakage path exists between the coupling legs 1 and 2. A gap area as shown in FIG. 6B exists between the distal ends of the flux coupling legs 1 and 2 where they confront the magnetic sensor 4. The width and length of this gap are identified as $W_g$ and $l_g$ respectively. The field through this gap will be at a maximum when the magnetically permeable legs 1 and 2 of the read head structure are positioned over the transition regions in tracks A and B for any given channel. The situation is illustrated in FIG. 6A. It will also be noted that the magnetically permeable legs 1 and 2 have a thickness in the direction of motion which will nominally be about ⅓ the distance $L_b$ between the closest successive magnetic transitions written along the medium 10. The thickness of a leg will be approximately 4,000 Angstrom units for example, when data is written at 20,000 flux changes per inch since $L_b$ will be approximately 12,000 Angstrom units under those conditions.

The legs 1 and 2 of the read head structure are designed so that the magnetic field crossing the sensor gap is intensified by a field concentration principle. The field coupled to the gap can be determined from the relative widths, thicknesses and lengths of the elements forming the magnetic coupling legs and the result is given by equation (1) below for the measurements assumed as shown below equation (1).

$$H_g = CH_D (W_s/W_g) [1/1 + (l_g/W_L)(H_L/W_g)] \qquad \text{Eq. (1)}$$

In Eq. (1), C is a coupling coefficient due to the flying height of the magnetic read head above the actual surface of the medium 10. It is (pessimistically) assumed to be ¼ for purposes of evaluating Eq. (1). $H_D$ is the demagnetizing field intensity of the medium and is assumed (conservatively) to be approximately 200 Oersteds (gauss). $W_s/W_g$ is the ratio between the coupling leg width at the magnetic interface to that at the gap as depicted in FIG. 6B and is selected to be approximately 3 for evaluating Eq. (1). $l_g/W_g$ is approximately ½ for the depiction given in FIG. 6B and $H_L/W_L$ is chosen to be approximately 1. It will be observed that several of these assumptions are most pessimistic. Utilizing these assumptions H in Eq. (1) can be evaluated to be approximately 100 gauss. Thus, given a sensor configured as shown for a read head structure depicted in FIG. 6A and using the assumptions given, we may assume that approximately ½ of the field present at the medium surface (200 gauss) will be passed through the gap. Further assuming that perhaps 50% of the gap field will be coupled to the sensor, the net field of approximately 50 gauss will be produced at the sensor. Sensors of this type typically are operated to produce one millivolt signal per gauss and a signal to noise ratio of 10 per gauss. Thus we should expect the electrical signals at the terminals of the sensor to have a peak signal amplitude of 50 millivolts and a signal to noise ratio of approximately 500 to 1.

Figure 7A:
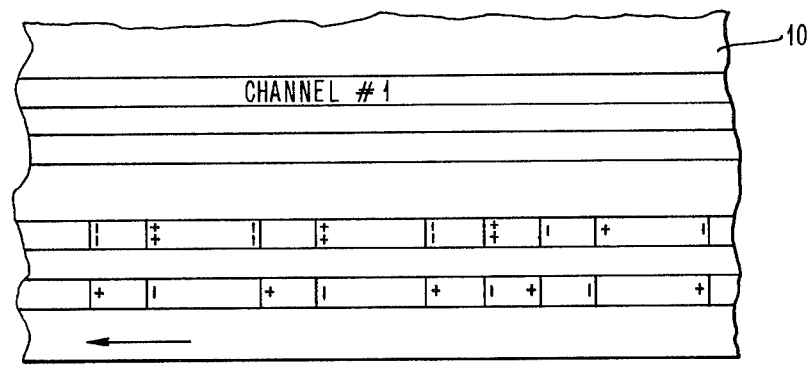
FIG. 7A illustrates a top or plan view of a magnetic medium written with two twin channel tracks of data recorded in the horizontal magnetization mode.
Figure 7B:
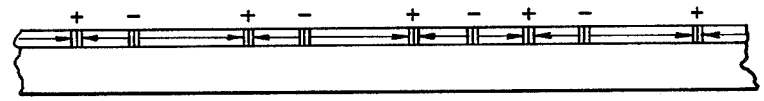
FIG. 7B illustrates a schematic horizontal cross section of the magnetic medium in FIG. 7A and showing the direction of magnetization.
Figure 7C:
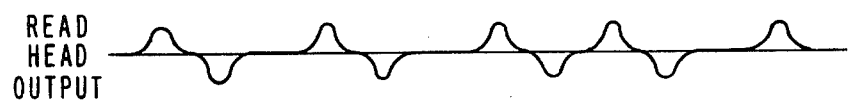
FIG. 7C illustrates the read head output signal amplitude for a read head similar to that shown in FIG. 6 scanning the data shown in FIGS. 7A and 7B.
Figure 7D:
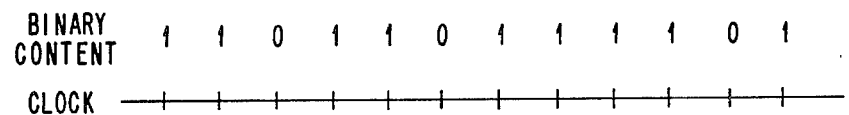
FIG. 7D illustrates the clock and data content extracted for the signal amplitude plot given in FIG. 7C.

Turning to FIGS. 7A through 7D, the results of a read/write technique described as applied to digital recording are depicted. FIG. 7A is a top or plan view of a schematic of several data channels written on a magnetic medium 10 (such as a tape) with an assumed direction of motion shown by the arrow. The data written by magnetic transitions sequentially in the channel arbitrarily selected as channel #2 are shown in the cross sectional view 7B. It may be observed that the magnetic transitions have been drawn in the horizontal mode and at the juncture or transition region, a series of small vertical lines have been written to show that a demagnitizing vertical field having components with the appropriate + or − sign will exist at this interface as shown in FIG. 7B. The read head signal output will follow the analog trace similar to that shown in FIG. 7C as the read head structure of FIG. 6 passes over the twin track channel having the data shown as channel #2 in FIG. 7A. The binary data output and the clocking required are shown in FIG. 7D positioned below the read head output analog chart in 7C.

It will be observed that the structure of the magnetic read head as shown in FIG. 6 operates in similar fashion to that shown in FIGS. 1 and 2. The coupling legs 1 and 2 are arranged to lie in proximity to complementarily poled magnetic transitions on the surface of a magnetic medium and to couple the maximum field intensity from these regions in the vertical plane to a magnetic sensor located in the gap between the two coupling legs.

Figure 8:
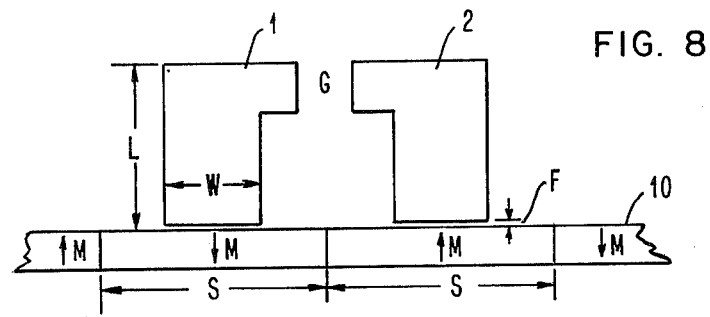
FIG. 8 illustrates the read head of a style similar to that shown in FIG. 6 but with the read head substrate elements turned 90° to lie generally along the axis of recording of the magnetic medium.
Figure 9:
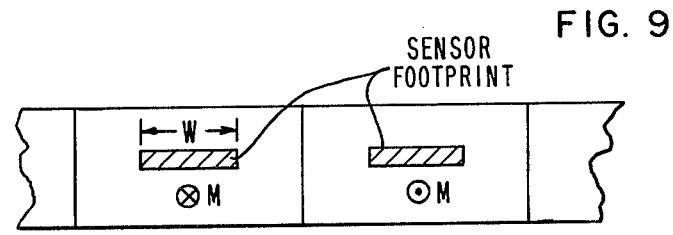
FIG. 9 illustrates a schematic plan view of the sensor input leg or coupling leg footprint sweeping along the vertically recorded track in FIG. 8.

As will be seen shortly, the structure depicted in FIG. 6 can also be used for reading data from a single track of information if the read head structure is turned 90° on its vertical axis in FIG. 6D so that both coupling legs 1 and 2 lie along the axis of a single track of data recorded on the magnetic medium 10. Such an orientation is schematically shown in FIGS. 8 and 9 and will be described in greater detail below. The density of data tracks that can be read using this particular orientation of the read head relative to the medium is very high and may exceed 12,000 or more data tracks per inch. The density in terms of flux changes per inch may be in the vicinity of 10,000 or more flux changes per inch. Thus extremely high density magnetically alterable digital data retention and read back is made possible.

Given the present state of technology, an active magnetically sensitive transistor with an emitter area (which is the active interface) approximately one micron in width (1 micrometer) is possible. The read head structure described so far can be configured with coupling leg thicknesses which are easily less than one micron wide. Thus, these legs will lie within the width of a data track on a magnetic medium which is only one micron wide. A signal to noise ratio in the vicinity of 200 to 1 is predicted for such a device.

The twin track per channel data reading method and read head have been described above. The same read head structure can be utilized to couple the fields from a single channel of vertically or horizontally recorded data bits to a magnetic sensor. The basic difference in use is that the plane for the magnetic sensor semiconductor chip is rotated 90° from the prior orientation depicted in FIG. 6, for example.

Turning to FIG. 8, a schematic drawing of the coupling legs 1 and 2 positioned above magnetic medium 10 which has been recorded in the vertical magnetization mode is illustrated. The gap in which a sensor is to be located is shown by the letter G between the distal ends of the magnetically permeable coupling legs 1 and 2.

FIG. 9 illustrates a plan view of the magnetic medium 10 with the footprint of the ends of the magnetically permeable legs 1 and 2 superimposed over it. It will be observed that the magnetically permeable legs are thin film generally planar members as they were in the previous drawings and that the longest dimension, the generally planar axis thereof, has been aligned to be approximately colinear with the long axis of the recorded data track on the medium 10. Due to the extreme thinness that is possible using film deposition techniques, the magnetically permeable legs 1 and 2 can easily be manufactured in the sub micron (micrometer) thickness range. Thus, the footprint of the coupling legs in FIG. 9 might be represented as small rectangles roughly a micron long and only about a fourth of a micron thick. With such tiny coupling leg dimensions, it is important that the sensor itself (to be positioned in the gap G in FIG. 8) be very small as well. As will soon be seen with reference to FIG. 10, it is the relative size of the gap G as compared with the transition to transition spacing S on the magnetic medium 10 that is important. It has a large effect on the relative field strength in the gap G that will be coupled by the legs 1 and 2 regardless of other considerations.

Figure 10:
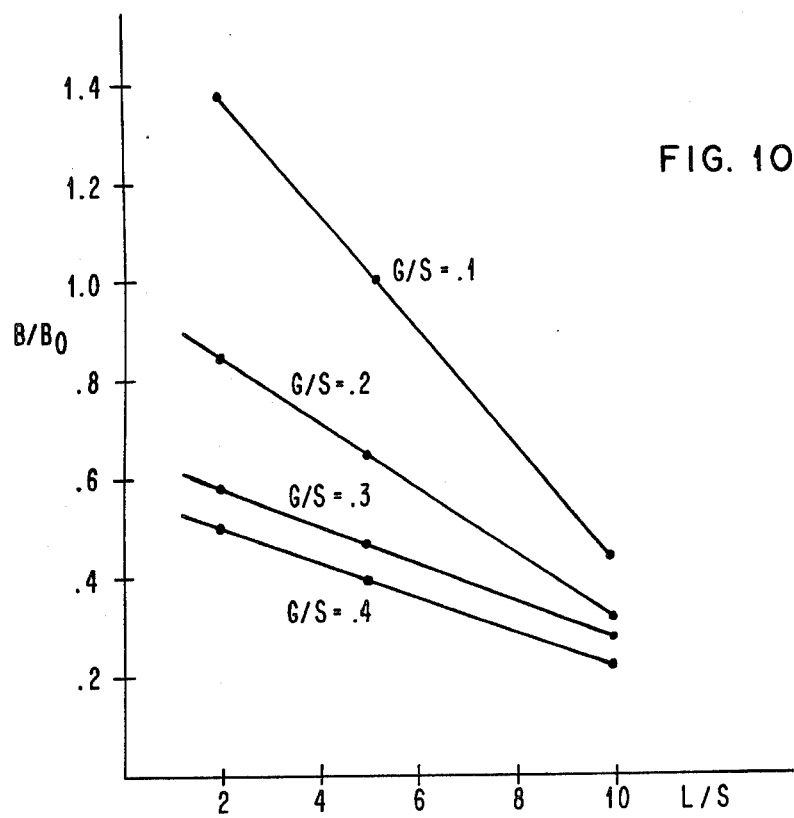
FIG. 10 illustrates a plot of the relative average magnetic field developed across the sensor gap as a function of the magnetic coupling leg length L and the gap width or length G as normalized by the transition to transition spacing or bit length S.
Figure 13:
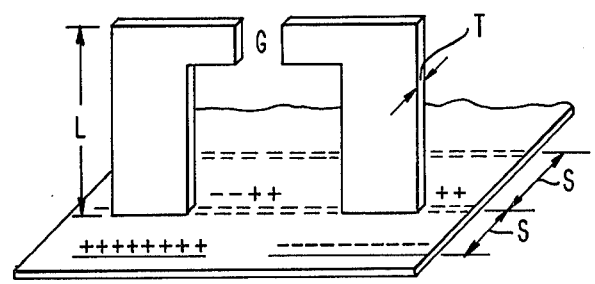
FIG. 13 is a schematic of coupling legs in a magnetic read head structure such as that shown in FIG. 6 positioned above a longitudinally recorded magnetic medium as depicted schematically in FIG. 6A.

Some design considerations based on studies conducted using models for the read head depicted in the figures will now be presented. FIG. 10 illustrates the relative strength of the magnetic field B as a percentage of the magnetic field on the surface of the medium 10, $B_0$ when the width of the gap G is a given portion of the transition to transition spacing S. The data is plotted with the length chosen for the coupling leg L normalized to the transition to transition spacing S. It may be observed that for a given length L as a proportion of the transition to transition spacing, for example, $L/S=5$, that the greatest coupling, i.e., the highest level of $B/B_0$ will be observed for the smallest gaps G. Hence, it is extremely important that the technology of the magnetic sensor element that is positioned in the gap be such that the sensor can be made in the micron or sub micron range.

The current capabilities of available electron beam processing technology limits the linear dimensions in which the semiconductive magnetic sensors described in my copending patent application Ser. No. 253,128, can be manufactured to the range of approximately one micron. Given this consideration, and the desire to have at least the majority of the magnetic field present on the surface of the medium 10 coupled to a sensor, recording densities of approximately 10,000 flux transitions per inch are reasonable with track densities of between 10,000 and 20,000 data tracks per inch on the medium ( a 1 micrometer wide track would approximate 16,666 data tracks per inch). Given a normal flying height for a read head moving above the medium 10, for example 10 micro inches, the bit density of 10,000 bits per inch with a 1 micron wide track or 16,666 data tracks per inch with ½ micron spacing between tracks would yield a total bit density relative to the surface of the medium that approaches that used in video disc technology today. Of course, magnetic data retention is alterable while the video disc is read only storage technology. The advantage of having magnetically alterable storage at such high densities will be immediately apparent.

Turning to FIG. 11, the effects of flying height (in microns) as a proportion of the transition to transition distance S and its effect on the field coupled to the gap are depicted. It is apparent that at the flying height of approximately 10% the transition to transition spacing, it would be most desirable to have the gap be no more than about three to four tenths the transition spacing width in order to couple something in the range of 40–60% of the available field to the gap. The FIG. 11 is plotted for a coupling leg length L equal to five times the transition spacing S. FIG. 12 illustrates a similar type of curve in which the length of the leg L is only twice the length of the transition to transition spacing. It will be observed that a significant increase in coupling of the incident field at the surface of the medium to the gap is thus achieved. For example, given a flying height of 1/10 the transition to transition spacing and a gap width of between 30 and 40% the transition to transition spacing, improvements in coupling could be in the range of 50% or more of the incident field $B_0$ are possible.

As well known to those of skill in the art, a typical value of the incident field at the medium surface ($B_0$) is equal at best to the coercive force of the magnetic material used in the medium. Typical values using iron oxide components would yield about 350 to 400 gauss at the surface as a value for $B_0$. Thus, given the capabilities of the sensor technology which yield sensitivities on the order of one millivolt per gauss and a total coupling efficiency of approximately 50% as depicted in FIGS. 10 and 11, it is not unreasonable to expect signals on the order of 200 millivolts from a sensor such as that described in my copending patent application Ser. No. 253,128 placed in the gap G in the figures.

Some experimentally measured data for the twin track recording and reading technique have also been developed.

Figure 14:
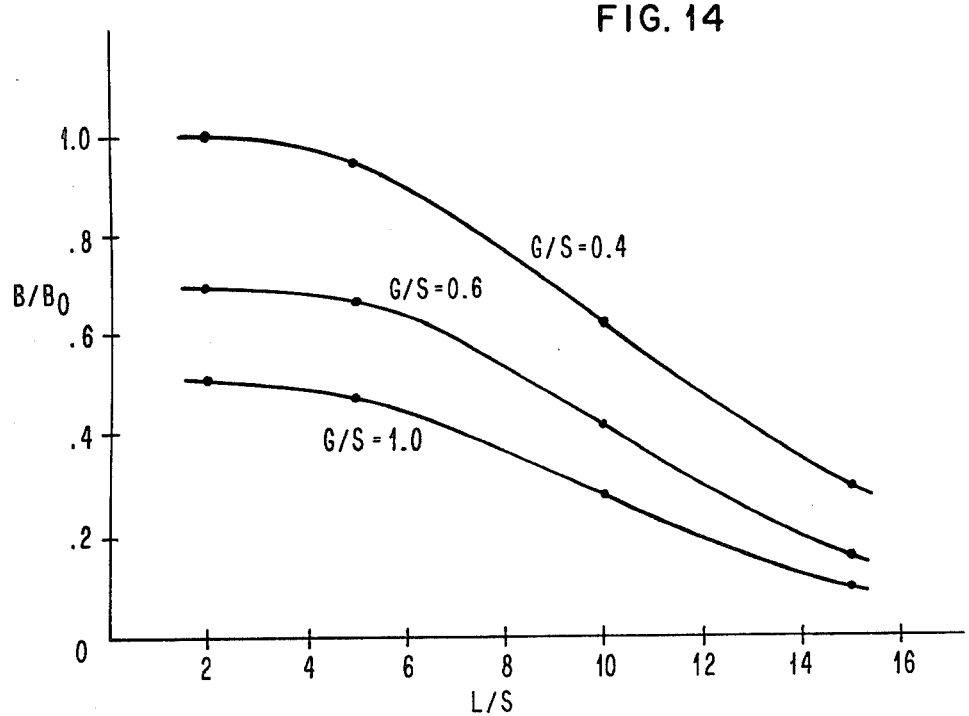
FIG. 14 is a plot of the relative field intensity experienced by a magnetic sensor positioned in the gap of the read head structure as a function of the magnetic coupling leg length L and gap width G normalized to the transition to transition spacing S for the twin track recording technique illustrated.

FIG. 14 illustrates a plot of the average relative field experienced in the gap G for magnetically permeable leg members 1 and 2 positioned above a vertically magnetically recorded medium 10 using the dual track recording technique. FIG. 14 shows the average field experienced in the gap as a function of the leg length L and the gap width G both of which have been normalized to the transition to transition spacing S. It is apparent the leg length L can be approximately five times the transition to transition spacing with little loss in the average field intensity coupled across the gap G. This leg length will be ample for the most practical embodiments in the twin track recording and reading technique. As observed above, the same read head structure can be utilized for reading a single track of data simply by rotating the head through 90° to align with the longitudinal axis of a single data track.

Figure 15A:
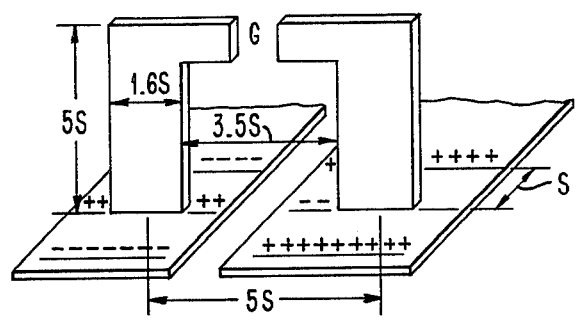
FIG. 15 is a plot of the average normalized field strength developed across the gap as a function of the gap length G as normalized to the transition to transition distance S for a flying height F of 0.
Figure 15B:
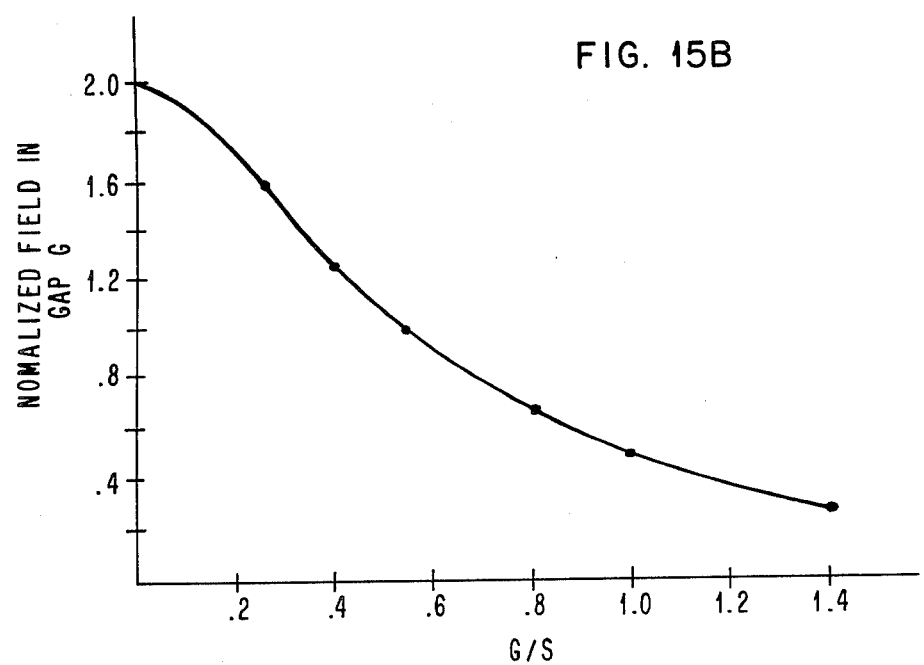

FIG. 15 is a plot of the average normalized field developed across the gap G as a function of the length of the gap G which has been normalized to the transition to transition spacing S. It is apparent from this figure that the maximum field coupled across the gap is about 50% of the field of the magnetic transition of the media when the gap width is equal to the transition to transition spacing. For shorter gap lengths, the field coupled across the gap will increase to a maximum value of approximately 200% of that incident at the surface of the medium. It is apparent from the graphs given that the gap length G should be approximately one micron or less given a recording density of approximately 20,000 flux changes per inch. This is about the limit of current processing technology since resolution for producing the sensitive emitter area for the sensing transistor to be placed in the gap lie in the one micron range.

Figure 17:
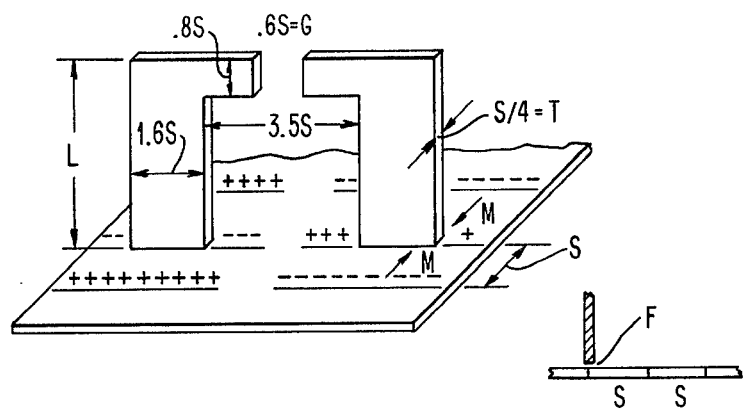
FIG. 17 is a schematic diagram showing the coupling legs of the read head structure of the present invention together with appropriate dimensions for the model in taking the data of FIG. 16.
Figure 16:
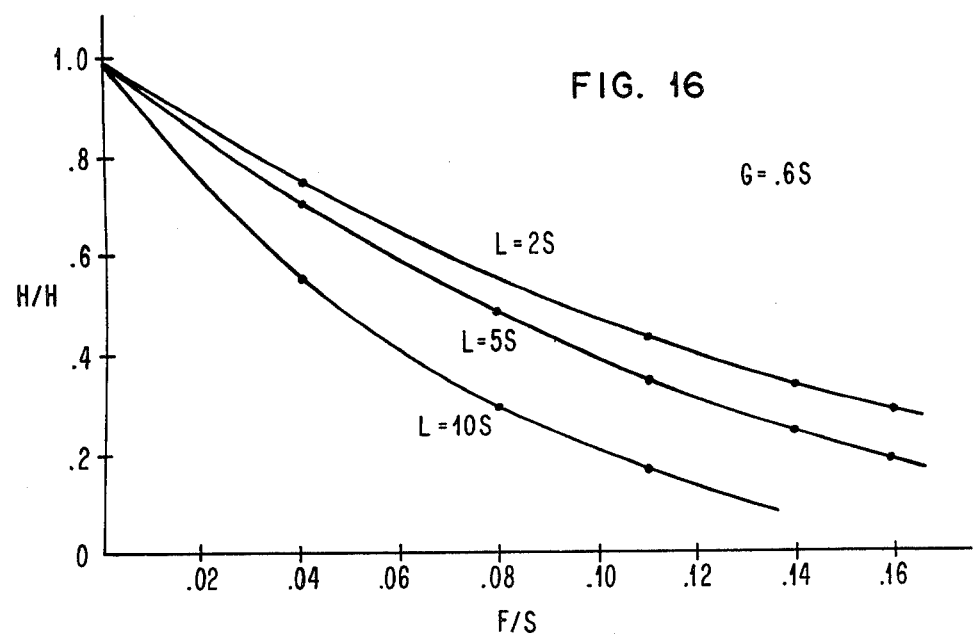
FIG. 16 is a plot of the normalized field coupled to a sensor in the gap as a function of flying height F and leg length L as normalized for the transition to transition spacing S.

In FIGS. 16 and 17, the effect of flying height F on the overall coupling of magnetic field through the gap G for the configuration as depicted in FIG. 17 is given. The flying height F and the leg length L have both been normalized to the transition interval S. It is apparent from FIG. 16 that the field coupled to a sensor, for a worst case data pattern of three successive isolated transitions, will rapidly fall as the flying height increases. A nominal value for leg length of five times the transition interval or typically ten microns (400 micro inches) is a good nominal figure.

The design approach for proper design of a storage system technology to accommodate a given read head would be to know what the expected nominal flying height of the read head mechanism would be and then pick a logical value for the ratio F/S. This value would dictate the density of data that can be written on the tracks and can also be used to predict the average field expected in the sensor gap. Then, knowing the sensitivity of the given sensor utilized, since many are available for the purpose, one can make a reasonable estimate of the output signal to be experienced.

As has been described with reference to several figures of preferred embodiments of magnetic read head structure and the detailed data on the design considerations and parameters for the heads, a new family of magnetic read head structures has been described. In these structures, the two magnetically permeable coupling legs are preferably of thin, generally planar cross section and are oriented in a generally vertical plane relative to the magnetic medium. They couple the vertical component of fields present on a magnetically written medium upwards and through a gap in which is located a magnetic sensor. The distal ends of the magnetically permeable legs which are proximate to the sensor may also be generally planar and preferably are aligned to focus the magnetic field through a plane in which the sensor is most responsive. If the sensor is one such as my magnetically sensitive transistors described in copending patent application Ser. No. 253,128, then the magnetically permeable coupling legs should be generally planar, have a maximum dimension of approximately as long as the longest dimension of the emitter in that type of magnetic sensor, and be oriented such that the field passes through the sensor in a plane parallel to the emissive surface of the emitter. The thin film technology method of constructing the magnetically permeable legs is easily integrated with the LSI processing techniques employed to build the sensors on silicon substrate chips. This being the case, the overall read head is easily manufactured as a single component with a sensor built directly upon a silicon chip and arranged as described in my previously-mentioned copending patent application to utilize the vertical mode of injection. The magnetically permeable legs may then be laid down in the plane of the chip and by appropriate etching techniques can be lowered such that they are aligned with the emissive surface of the vertically injecting emitter thus produced. This brings the plane of the ends of the coupling legs into the most active plane parallel with the emissive surface for the sensor as described and produces the best response.

Having thus described my invention with reference to several preferred embodiments and the best mode presently known of practicing it, it will be instantly apparent to those of skill in the art that numerous departures from the basic configuration shown will be possible without violating the basic teachings and concepts of the invention. Therefore, the claims which follow are not intended to be limited by any reference to specific dimensions, materials, or sensor technologies but are structural descriptions of the most preferred embodiments. These utilize the complementary magnetic polarity coupling by two magnetically permeable legs to the active plane of a transducer or sensor. Therefore, the claims which follow should be taken by way of general description and not by limitation.

Having thus described my invention, what I desire to protect by Letters Patent is:

1. A magnetic read head structure, comprising:
   a magnetically responsive electrical transducer element having a preferentially sensitive plane for sensing magnetic fields;
   at least two magnetically permeable field coupling legs, said legs being non-contacting and having proximate and distal ends;
   said proximate ends being arranged to confront a magnetically recorded medium whose content is to be read and,
   said distal ends being arranged to form a magnetic field gap;
   said magnetically sensitive electrical transducer element being located in said gap and oriented so that the magnetic field in said gap passes through said transducer in a plane parallel to said preferentially sensitive plane therein.

2. A magnetic read head structure as described in claim 1, and further comprising:
   said legs being generally planar in cross section at said proximate ends and being arranged generally perpendicular to said magnetically recorded medium and colinear with the long axis of a stream of magnetic changes recorded thereon.

3. A magnetic read head structure as described in claim 2 and further comprising:
   said legs being generally planar in cross section at said distal ends also and said distal ends being arranged relative to said magnetically sensitive electrical transducer element to direct said magnetic field in said gap in a generally planar fashion through said transducer element.

4. A magnetic read head structure as described in claim 1 or 2 or 3, wherein:
   said proximate ends of said legs are spaced apart from each other by a distance greater than ½ the width of a single stream of magnetic changes recorded on said medium and further being arranged in proximity to and generally coplanar with the short axis of at least two said recorded data streams to couple magnetic flux fields from one said stream, through one of said legs and through said gap to said other leg and therethrough to said other data stream in a completed flux coupling circuit.

5. A magnetic read head structure as described in claim 1 or 2 or 3, wherein:
   said proximate ends of said legs are arranged to lie in a vertical plane or planes relative to said medium and to align with magnetically recorded transitions in magnetization polarity thereon at some time during the motion of said medium relative to said read head.

* * * * *